(12) United States Patent
Sundgren et al.

(10) Patent No.: US 11,183,612 B2
(45) Date of Patent: Nov. 23, 2021

(54) METHOD FOR PRODUCING AT LEAST ONE OPTOELECTRONIC COMPONENT, AND OPTOELECTRONIC COMPONENT

(71) Applicant: OSRAM OLED GmbH, Regensburg (DE)

(72) Inventors: Petrus Sundgren, Lappersdorf (DE); Christoph Klemp, Regensburg (DE)

(73) Assignee: OSRAM OLED GMBH, Regensburg (DE)

(*) Notice: Subject to any disclaimer, the term of this patent is extended or adjusted under 35 U.S.C. 154(b) by 0 days.

(21) Appl. No.: 16/758,172

(22) PCT Filed: Oct. 23, 2018

(86) PCT No.: PCT/EP2018/078987
§ 371 (c)(1),
(2) Date: Apr. 22, 2020

(87) PCT Pub. No.: WO2019/081480
PCT Pub. Date: May 2, 2019

(65) Prior Publication Data
US 2020/0313034 A1 Oct. 1, 2020

(30) Foreign Application Priority Data
Oct. 27, 2017 (DE) .................. 10 2017 125 217.7

(51) Int. Cl.
*H01L 33/00* (2010.01)
*H01L 21/78* (2006.01)

(52) U.S. Cl.
CPC ...... *H01L 33/0093* (2020.05); *H01L 21/7806* (2013.01)

(58) Field of Classification Search
CPC .................. H01L 33/0093; H01L 21/7806
See application file for complete search history.

(56) References Cited

U.S. PATENT DOCUMENTS

| | | | |
|---|---|---|---|
| 2008/0108171 A1* | 5/2008 | Rogers | H01L 21/6835 438/73 |
| 2008/0207004 A1* | 8/2008 | Sparks | H01L 29/78639 438/739 |

(Continued)

FOREIGN PATENT DOCUMENTS

WO 2004099473 A1 11/2004

OTHER PUBLICATIONS

Lecture Notes, 2005, pp. 17-18 <https://ocw.mit.edu/courses/electrical-engineering-and-computer-science/6-152j-micro-nano-processing-technology-fall-2005/lecture-notes/lecture17.pdf> (Year: 2005).*

(Continued)

*Primary Examiner* — Robert G Bachner
*Assistant Examiner* — Molly K Reida
(74) *Attorney, Agent, or Firm* — MH2 Technology Law Group LLP

(57) ABSTRACT

The invention relates to a method for producing at least one optoelectronic component (100) comprising the steps
A) providing an auxiliary carrier (1),
B) epitaxially applying a sacrificial layer (2) on the auxiliary carrier (1), wherein the sacrificial layer (2) comprises germanium,
C) epitaxially applying a semiconductor layer sequence (3) on the sacrificial layer (2),
D) removing the sacrificial layer (2) by means of dry etching (9), such that the auxiliary carrier (1) is removed from the semiconductor layer sequence (3).

17 Claims, 3 Drawing Sheets

(56) References Cited

U.S. PATENT DOCUMENTS

Figure 1:
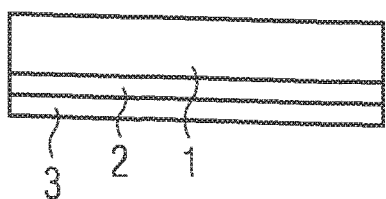
Figure 1:
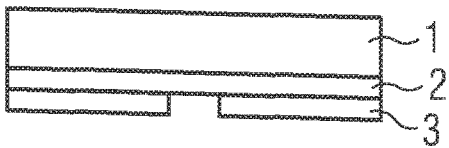
Figure 1:
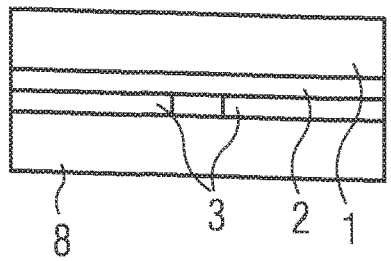
Figure 1:
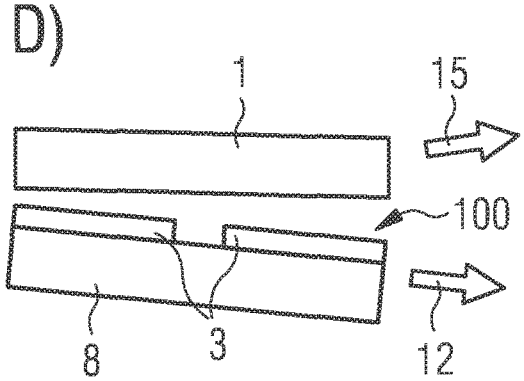

| | | |
|---|---|---|
| 2010/0147370 A1 | 6/2010 | He et al. |
| 2012/0228627 A1 | 9/2012 | Sazawa |
| 2014/0203408 A1* | 7/2014 | Takada .............. H01L 21/02002 257/618 |
| 2014/0247519 A1* | 9/2014 | Takizawa ................ G11B 5/72 360/110 |
| 2015/0021624 A1 | 1/2015 | Meyer et al. |
| 2017/0069491 A1* | 3/2017 | Cheng ................ H01L 21/2056 |

OTHER PUBLICATIONS

Cole et al., "Free-standing AlxGa1-xAs heterostructures by gas-phase etching of germanium", Applied Physics Letters, vol. 96, 2010, 4 pages.

Geisz et al., "40.8% efficient inverted triple-junction solar cell with two independently metamorphic junctions", Applied Physics Letters, vol. 93, 2008, 4 pages.

International Search Report and Written Opinion in corresponding International Application No. PCT/EP2018/078987 dated Feb. 12, 2019, 13 pages.

* cited by examiner

A)

B)

C)

D)

A)

B)

C)

D)

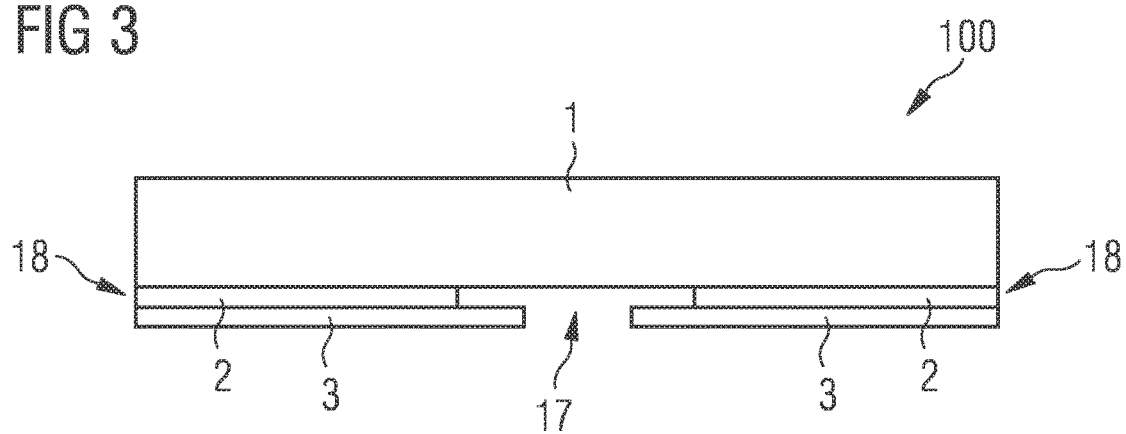

METHOD FOR PRODUCING AT LEAST ONE OPTOELECTRONIC COMPONENT, AND OPTOELECTRONIC COMPONENT

The invention relates to a method for producing at least one optoelectronic component. The invention further relates to an optoelectronic component.

CROSS-REFERENCE TO RELATED APPLICATION(S)

This patent application is a national stage entry from International Application No. PCT/EP2018/078987, filed on Oct. 23, 2018, published as International Publication No. WO 2019/081480 A1 on May 2, 2019, and claims priority under 35 U.S.C. § 119 from German patent application 10 2017 125 217.7, filed Oct. 27, 2017, the entire contents of all of which are incorporated herein by reference.

Semiconductor layer sequences for optoelectronic components, for example light-emitting diodes, are usually grown epitaxially on an auxiliary carrier. The auxiliary carrier must subsequently be removed again so that it does not become part of the final optoelectronic component, for example, a thin-film LED. The auxiliary carrier should be removed non-destructively so that it can be reused. However, non-destructive removal is in particular difficult for a GaAs auxiliary carrier on which a semiconductor layer sequence of AlInGaP was grown.

One object of the invention is to provide a method for producing at least one optoelectronic component which produces a reusable auxiliary carrier. Furthermore, it is the object of the invention to provide an optoelectronic component which can be produced easily and quickly, in particular by the method described here.

This object is or these objects are solved by a method for producing at least one optoelectronic component according to claim 1. Advantageous embodiments and further developments of the invention are subject of the dependent claims. Furthermore, this object or these objects are solved by an optoelectronic component according to claim 16.

In at least one embodiment, the method for producing at least one optoelectronic component, in particular exactly one optoelectronic component, comprises the steps A) providing an auxiliary carrier, B) epitaxially applying a sacrificial layer on the auxiliary carrier, wherein the sacrificial layer comprises germanium, C) epitaxially applying a semiconductor layer sequence on the sacrificial layer, D) removing the sacrificial layer by means of dry etching, such that the auxiliary carrier is removed from the semiconductor layer sequence.

The invention further relates to an optoelectronic component. Preferably, the optoelectronic component is produced by the method described here. All definitions and embodiments for the method for producing the optoelectronic component also apply to the optoelectronic component and vice versa.

According to at least one embodiment, the method comprises a step A), providing an auxiliary carrier. The auxiliary carrier may, for example, comprise one or more materials in the form of a layer, a plate, a foil or a laminate selected from glass, quartz, plastic, metal, silicon wafer. In particular, the substrate is a single crystal. Preferably, the auxiliary carrier is formed of gallium arsenide or comprises gallium arsenide.

The auxiliary carrier is preferably equipped temporarily. This means here that the auxiliary carrier is removed again in a later method step, in particular in step D), so that the auxiliary carrier is not part of the finished optoelectronic component.

According to at least one embodiment, the method comprises a step B), epitaxially applying a sacrificial layer on the auxiliary carrier. The sacrificial layer comprises germanium or consists of germanium. Consisting of can mean that the sacrificial layer is formed of 100% germanium. Consisting can alternatively mean that in addition to germanium, small impurities, especially in the ppm range, are present in the sacrificial layer.

According to at least one embodiment, the epitaxial application is carried out by means of metal organic vapor phase epitaxy (MOVPE). Metal organic vapor phase epitaxy is well known to the person skilled in the art and will therefore not be explained in detail here.

According to at least one embodiment, the sacrificial layer is epitaxially applied over the entire surface of the auxiliary carrier. In this case, over the entire surface can mean here that the sacrificial layer in step B) comprises no structuring.

According to at least one embodiment, the auxiliary carrier comprises GaAs or consists thereof.

According to at least one embodiment, the auxiliary carrier is removed non-destructively.

According to at least one embodiment, the method comprises a step C), epitaxially applying a semiconductor layer sequence on the sacrificial layer. Epitaxially applying the semiconductor layer sequence can be carried out by means of metal-organic gas phase epitaxy.

The fact that a layer or an element is arranged or applied "on" or "over" another layer or another element can mean here and in the following that the one layer or the one element is arranged directly in direct mechanical and/or electrical contact on the other layer or the other element. Furthermore, it may also mean that the one layer or the one element is arranged indirectly on or above the other layer or the other element. Further layers and/or elements can then be arranged between the one and the other layer or between the one and the other element.

According to at least one embodiment, the semiconductor layer sequence comprises at least one III-V compound semiconductor material. The semiconductor material is for example a nitride compound semiconductor material, such as $Al_nIn_{1-n-m}Ga_mN$ or a phosphide compound semiconductor material, such as $Al_nIn_{1-n-m}Ga_mP$ or also an arsenide compound semiconductor material, such as $Al_nIn_{1-n-m}Ga_mAs$, where $0 \leq n \leq 1$, $0 \leq m \leq 1$ and $n+m \leq 1$ respectively. The semiconductor layer sequence can comprise dopants and additional components. For the sake of simplicity, however, only the essential constituents of the crystal lattice of the semiconductor layer sequence, i.e. Al, As, Ga, In, N or P, are given, even if these may be partially replaced and/or supplemented by small amounts of other substances. In particular, the semiconductor layer sequence is formed from AlInGaP.

The optoelectronic component or the semiconductor layer sequence includes an active layer with at least one pn junction and/or with one or more quantum well structures. During operation of the optoelectronic component, electromagnetic radiation is generated in the active layer. A wavelength or the wavelength maximum of the radiation is preferably in the ultraviolet and/or IR and/or visible range, in particular at wavelengths between 550 nm and 1400 nm inclusive, for example between 560 nm and 1250 nm inclusive.

According to at least one embodiment, the optoelectronic component is a light-emitting diode, or LED for short. The optoelectronic component is then preferably designed to emit green, yellow, red or infrared light.

According to at least one embodiment, the semiconductor layer sequence is epitaxially applied directly, i.e. in direct contact, on the sacrificial layer. Alternatively, a buffer layer can be epitaxially applied between the sacrificial layer and the semiconductor layer sequence. The buffer layer can be made of gallium arsenide, for example.

According to at least one embodiment, the method comprises a step D), removing the sacrificial layer by means of dry etching. By removing the sacrificial layer, the auxiliary carrier can be removed or separated from the semiconductor layer sequence. In particular, the auxiliary carrier is removed non-destructively from the semiconductor layer sequence.

Alternatively or additionally, the semiconductor layer sequence is removed from the auxiliary carrier non-destructively. Thus, the auxiliary carrier can be reused for further processes, in particular for further epitaxial application processes.

According to at least one embodiment, the semiconductor layer sequence is epitaxially applied over the entire surface of the sacrificial layer in step C).

The semiconductor layer sequence and/or the sacrificial layer can be structured in a subsequent work step. The structuring can be done in different ways. Purely mechanical methods (e.g. sawing) are just as conceivable as chemical methods, i.e. lithography with subsequent etching processes. Furthermore, combinations of both methods are also possible. For etching, both wet chemical (e.g.: HCl- or BrO3- etching) as well as dry chemical processes (e.g.: ICP with Cl plasma) are suitable, wherein sufficiently good end point detection or selectivity (between semiconductor layer sequence and sacrificial layer) represent an edge condition. Thus, structuring, in particular mesa trenches, can be produced both in the sacrificial layer and in the semiconductor layer sequence or only in the sacrificial layer or only in the semiconductor layer sequence. Thus, the degree of fragmentation of the sacrificial layer can be increased and thus step D) can be carried out faster. This saves costs and material.

According to at least one embodiment, the semiconductor layer sequence is structured after step C).

According to at least one embodiment, the method is carried out in the order A) to D) described here. In particular, further method steps can also exist between the individual method steps.

According to at least one embodiment, the dry etching in step D) is selected from a group comprising inductive coupled plasma (ICP), reactive ion etching (RIE) and vapor hydrofluoric acid method (VHF).

Reactive ion etching (RIE) is an ion-assisted reactive process. The RIE is a plasma-assisted etching process. In particular, the material is removed with the aid of plasma-activated gases and accelerated ions, such as argon ions. Reactive ion etching (RIE) is sufficiently known to the person skilled in the art and will therefore not be explained in detail here.

The dry etching processes described here are not wet chemical processes.

Alternatively, dry etching can be carried out using inductively coupled plasma (ICP). ICP is sufficiently known to the person skilled in the art and is therefore not explained in detail here. For example, ICP can be carried out with $SF_6$ at a flow rate of 500 sccm, an ICP power of 4500 W, a pressure of 200 mTorr (=0.27 mbar) and/or at room temperature. In particular, the sacrificial layer is removed dry-chemically at the parameters mentioned here.

According to at least one embodiment, the dry etching is a vapor hydrofluoric acid method (VHF). VHF is sufficiently well known to the person skilled in the art and will therefore not be explained in detail here.

According to at least one embodiment, the auxiliary carrier comprises a material or consists of the material which has a lattice constant corresponding to the lattice constant of germanium. Preferably, the auxiliary carrier is formed of gallium arsenide and thus has a similar or identical lattice constant as germanium.

The inventors recognized that by using a sacrificial layer of germanium, both the semiconductor layer sequence and the auxiliary carrier can be separated from each other non-destructively. As a rule, a semiconductor layer sequence of AlGaAs is difficult to etch without damaging the semiconductor layer sequence. Up until now, only wet chemical etching processes have been known for this purpose, wherein, however, its parameters are difficult to control.

By using germanium as the sacrificial layer instead of AlGaAs, dry etching processes can be used to remove the sacrificial layer, so that the auxiliary carrier can be removed non-destructively and is reusable.

According to at least one embodiment, the sacrificial layer of germanium is removed after the semiconductor layer sequence has been structured. In particular, the structuring is a mesa opening.

According to at least one embodiment, the germanium layer is completely removed in step D). Thus, in particular the auxiliary carrier of gallium arsenide can be reused for further processes. The mesa-structured semiconductor layer sequence can be transferred to another carrier or to another substrate and further processed.

According to at least one embodiment, at least one gaseous by-product is formed in step D). In particular, the gaseous by-product is germanium tetrachloride or it comprises germanium tetrachloride.

For example, germanium tetrachloride can be formed during inductively coupled plasma etching (ICP) with at least one of the following process gases: $Cl_2$, $SiCl_2$, $BCl_3$, $CCl_2F_2$. A possible further component of the process gas is at least one of the following materials: argon, helium, oxygen.

The germanium tetrachloride so obtained can be advantageously used in another application such as the production of optical waveguides made of quartz glass to produce a high-purity germanium(IV) oxide layer in the core of a quartz fiber.

According to at least one embodiment, the arrangement produced in step C) is applied to a substrate before step D), such that the substrate is arranged on the side of the semiconductor layer sequence facing away from the auxiliary carrier. The substrate can be silicon, silicon carbide, silicon oxide such as glass/quartz, germanium, gallium arsenide, diamond, metals, metal oxides such as sapphire, or plastic.

According to at least one embodiment, at least steps B) and C) are repeated such that an alternating arrangement of sacrificial layers and semiconductor layer sequences is generated in vertical direction to the auxiliary carrier. Step D) can then be performed selectively so that the sacrificial layers are removed one after the other. Different or identical optoelectronic components and a plurality of optoelectronic components which were previously arranged on an auxiliary carrier can thus be produced. Thus, auxiliary carriers can be saved.

According to at least one embodiment, a first semiconductor layer sequence is arranged on a first substrate before step D). Then step D) is carried out for removing the first sacrificial layer so that a first component is produced. The first component comprises the first semiconductor layer sequence and the first substrate. A second substrate is then arranged on the second semiconductor layer sequence. Then step D) is carried out again to remove the second sacrificial layer to create a second component. The second component comprises the second semiconductor layer sequence and the second substrate. This process can be repeated as often as required and therefore a large number of optoelectronic components can be produced.

In particular, epitaxially applying the respective semiconductor layer sequence on an auxiliary carrier is carried out in vertical direction to the auxiliary carrier. Thus, an alternating arrangement of a plurality of semiconductor layer sequences and sacrificial layers are arranged on an auxiliary carrier, which, by selectively removing the sacrificial layers, are then sequentially applied on a respective substrate and then removed again. Thus, a plurality of optoelectronic components can be produced by means of an auxiliary carrier.

According to at least one embodiment, the first semiconductor layer sequence on the first substrate and the second semiconductor layer sequence on the second substrate are structured differently. The structuring can take place after or before step D). As described above, such a structuring can be produced mechanically and/or by dry or wet chemical etching.

According to at least one embodiment, the sacrificial layer comprises a layer thickness between 2 nm and 20 µm, in particular between 10 nm and 10 µm, for example 100 nm to 1000 nm.

According to at least one embodiment, an auxiliary carrier of gallium arsenide is provided in step A). The sacrificial layer of germanium is epitaxially grown on the gallium arsenide auxiliary carrier in step B). The sacrificial layer of germanium, for example, comprises a layer thickness of between 2 nm and 20 µm. Subsequently, the semiconductor layer sequence of AlInGaP is epitaxially grown in step C). The sacrificial layer is subsequently removed in step D), so that the auxiliary carrier is removed and is configured to be reused as an auxiliary carrier for epitaxial deposition. In other words, the auxiliary carrier can be removed non-destructively in step D) and thus be reused for further processes.

According to at least one embodiment, a buffer layer of gallium arsenide is applied between the sacrificial layer and the auxiliary carrier. The buffer layer can be applied by means of epitaxy, for example by MOVPE.

Further advantages, advantageous embodiments and further developments result from the exemplary embodiments described below in conjunction with the figures.

FIGS. 1A to 1D show a method for producing an optoelectronic component according to an embodiment, FIGS. 2A to 2D show a method for producing a plurality of optoelectronic components, here with the example of two optoelectronic components, according to an embodiment, and FIG. 3 shows a schematic side view of an optoelectronic component according to a method step.

In the exemplary embodiments and in the figures, identical, similar or similarly acting elements may each be provided with the same reference signs. The depicted elements and their proportions among each other are not to be regarded as true to scale. Rather, individual elements, such as layers, components, parts and areas can be shown in exaggerated size for better representability and/or better understanding.

FIGS. 1A to 1D show a schematic side view of a method for producing an optoelectronic component according to an embodiment.

According to FIG. 1A, an auxiliary carrier 1 is provided, for example made of gallium arsenide. The sacrificial layer 2 of germanium is epitaxially applied to this auxiliary carrier.

Subsequently, in step C), the semiconductor layer sequence 3 is epitaxially applied.

Subsequently, a structuring step can be carried out.

In particular, the semiconductor layer sequence 3 is structured so that, for example, the size of the semiconductor layer sequence 3 can be defined (FIG. 1B). The structuring can be carried out in different ways. Purely mechanical methods (e.g. sawing) are just as conceivable as chemical methods, i.e. lithography with subsequent etching processes. Furthermore, combinations of both methods are also possible. For etching, both wet chemical (e.g.: HCl- or BrO3- etching) and dry chemical processes (e.g.: ICP with Cl plasma) are suitable, wherein sufficiently good end point detection or selectivity (between semiconductor layer sequence and sacrificial layer) represent an edge condition.

Subsequently, as shown in FIG. 1C, the arrangement produced in FIG. 1B can be applied to a substrate 8. The substrate 8 can be silicon (carbide and oxides, such as glass/quartz), germanium, gallium arsenide, diamond, metals (and oxides, such as sapphire) or plastic. The substrate 8 is arranged on the side of the semiconductor layer sequence 3 opposite the auxiliary carrier 1. This process can also be referred to as rebonding 14.

Subsequently, step D) can be carried out as shown in FIG. 1D, wherein the sacrificial layer 2 is removed. Removing can be carried out by dry etching 9 of germanium, for example. In this process, for example, halogen-containing gases can be used, so that germanium tetrachloride can be released as a reaction product or by-product, and thus the sacrificial layer can be completely removed.

As dry etching 9, ICP, RIE or VHF can be used. In this way, the auxiliary carrier 1 can be removed non-destructively from the semiconductor layer sequence 3 and the substrate 8.

Auxiliary carrier 1 can be reused 15. The produced optoelectronic component 100, which comprises the substrate 8 and the semiconductor layer sequence 3, can be used for further processes 12.

Alternatively, a structuring of the semiconductor layer sequence 3 may be omitted.

FIGS. 2A to 2D show a method for producing a plurality of optoelectronic components, here with the example of two optoelectronic components 101, 102, according to an embodiment.

Figure 2:
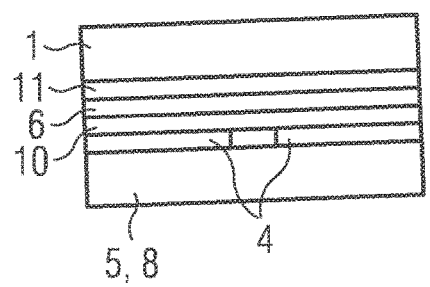
Figure 2:
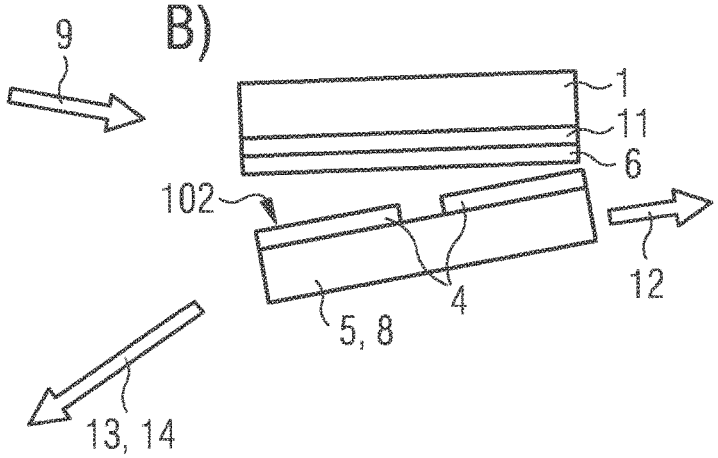
Figure 2:
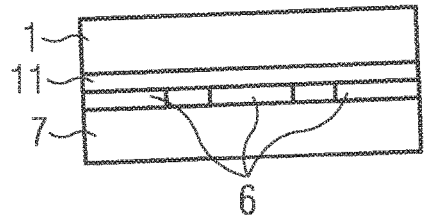
Figure 2:
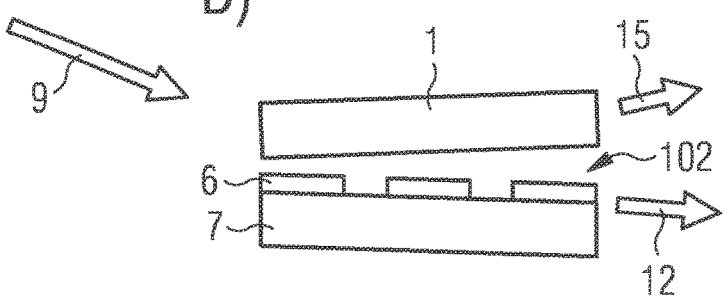

According to FIG. 2A, an auxiliary carrier 1, for example made of gallium arsenide, is provided. A second sacrificial layer 11 is epitaxially applied to this auxiliary carrier. Subsequently, a second semiconductor layer sequence 6 is applied. The application is carried out epitaxially. A first sacrificial layer 10 is applied to the second semiconductor layer sequence 6. Subsequently, a first semiconductor layer sequence 4 is applied to the first sacrificial layer 10.

The sacrificial layers 11 and 10 can comprise germanium or consist of germanium.

Subsequently, as already described in FIG. 1B, the semiconductor layer sequences 4, 6, for example the first semiconductor layer sequence 4, can be structured. However, the structuring can also be omitted. After structuring, a substrate 8, in this case a first substrate 5, can be attached to or on the first semiconductor layer sequence 4.

Subsequently, dry etching 9 of the first sacrificial layer 10 is carried out, so that a first component 101 is produced, which comprises a first substrate 5 and a first semiconductor layer sequence 4. In particular, the second sacrificial layer 11 is sealed so that it is not removed.

The first component 101 can be used for further processes 12.

Subsequently, the now exposed second semiconductor layer sequence 6 can be structured. This structuring can also be omitted. In addition, a second substrate 7 can be attached to the second semiconductor layer sequence 6. The second sacrificial layer 11 is removed by dry etching 9, so that the auxiliary substrate 1 can be removed non-destructively from the second semiconductor layer sequence 6 and is reusable 15. The second component 102 comprises a second substrate 7 and a second semiconductor layer sequence 6. In this case, the second semiconductor layer sequence 6 is formed in a structured manner. The second component 102 can be used for further processing steps 12.

The structured areas of the semiconductor layer sequences 4, 6 of the respective components 101, 102 can comprise different sizes and/or number on the respective substrate 5, 7, 8.

The optoelectronic components can be formed identically or differently. The different components 101, 102 are originally located on a common auxiliary carrier 1. The components 101, 102 can have the same or different structuring, so that the same or different sizes of the semiconductor layer sequences 3, 4, 6 can be produced.

In this example, the first semiconductor layer sequence 4 and the second semiconductor layer sequence 6 have different forms. For example, the semiconductor layer sequences 4, 6 comprise different emitting wavelength ranges. For example, the first semiconductor layer sequence 4 emits yellow light and the second semiconductor layer sequence 6 emits red light.

FIG. 3 shows a schematic side view of an optoelectronic component according to one method step.

The component has an auxiliary carrier 1 on which a structured sacrificial layer 2 is applied. A structured semiconductor layer sequence 3 is arranged on this structured sacrificial layer 2. The semiconductor layer sequence 3 comprises a continuous mesa trench 17 as a structuring in vertical direction. By structuring the semiconductor layer sequence 3, the etching of the sacrificial layer 2 can be carried out from all exposed sides in the area of the mesa trench 17 and the outer sides 18 of the sacrificial layer 2. Thus, the sacrificial layer 2 can be removed quickly.

The mesa trench can be used as a channel for the transport of the starting materials so that the sacrificial layer can be removed more easily and quickly. The outer sides 18 of the sacrificial layer 2 and also the areas of the mesa trench of the semiconductor layer sequence 3 are, in particular, not sealed so that the sacrificial layer 2 can be easily removed in the further method step by means of dry etching.

The exemplary embodiments described in conjunction with the figures and their features can also be combined with each other according to further exemplary embodiments, even if such combinations are not explicitly shown in the figures. Furthermore, the exemplary embodiments described in conjunction with the figures may have additional or alternative features according to the description in the general part.

The invention is not limited to the exemplary embodiments by the description. Rather, the invention comprises each new feature as well as each combination of features, which in particular includes each combination of features in the patent claims, even if this feature or this combination itself is not explicitly indicated in the patent claims or exemplary embodiments.

This patent application claims the priority of the German patent application 10 2017 125 217.7, the disclosure content of which is hereby incorporated by reference.

REFERENCES

100 optoelectronic component
101 first optoelectronic component
102 second optoelectronic component
1 auxiliary carrier
2 sacrificial layer
3 semiconductor layer sequence
4 first semiconductor layer sequence
5 first substrate
6 second semiconductor layer sequence
7 second substrate
8 substrate or carrier
9 dry etching
10 first sacrificial layer
11 second sacrificial layer
12 further processing
13 structuring
14 rebonding or applying to substrate
15 reuse
16 buffer layer
17 mesa trench
18 outer sides of the sacrificial layer

The invention claimed is:

1. A method for producing at least one optoelectronic component comprising:
   A) providing an auxiliary carrier,
   B) epitaxially applying a sacrificial layer on the auxiliary carrier, wherein the sacrificial layer consists of germanium,
   C) epitaxially applying a semiconductor layer sequence on the sacrificial layer,
   D) removing the sacrificial layer by dry etching such that the auxiliary carrier is removed from the semiconductor layer sequence, wherein
   the dry etching is a methods comprising inductively coupled plasma (ICP), reactive ion etching (RIE), vapor hydrofluoric acid method (VHF), and
   at least one of the following process gases is used for the dry etching: $SiCl_2$, $BCl_3$, and $CCl_2F_2$.

2. The method according to claim 1, wherein the auxiliary carrier comprises GaAs.

3. The method according to claim 1, wherein the semiconductor layer sequence is structured after step C).

4. The method according to claim 1, wherein the removal of the auxiliary carrier is non-destructive.

5. The method according to claim 1, wherein the auxiliary carrier comprises a material with a lattice constant corresponding to the lattice constant of germanium.

6. The method according to claim 1, wherein at least one gaseous by-product is formed in step D).

7. The method according to claim 6,
wherein the gaseous by-product is germanium tetrachloride.

8. The method according to claim 1,
wherein the arrangement produced in step C) is applied to a substrate before step D) such that the substrate is arranged on the side of the semiconductor layer sequence facing away from the auxiliary carrier.

9. The method according to claim 1,
wherein steps B) and C) are repeated such that an alternating arrangement of sacrificial layers and semiconductor layer sequences is produced in vertical direction to the auxiliary carrier, wherein step D) is performed selectively such that the sacrificial layers are removed successively.

10. The method according to claim 9,
wherein a first semiconductor layer sequence is arranged to a first substrate before step D), then step D) is carried out to remove the first sacrificial layer such that a first component comprising the first semiconductor layer sequence and the first substrate is produced, then a second substrate is arranged on the second semiconductor layer sequence, then step D) is carried out to remove the second sacrificial layer such that a second component comprising the second semiconductor layer sequence and the second substrate is produced.

11. The method according to claim 10,
wherein the first semiconductor layer sequence on the first substrate and the second semiconductor layer sequence on the second substrate are structured differently, wherein the structuring is carried out after step D).

12. The method according to claim 1,
wherein the sacrificial layer has a layer thickness between 2 nm and 20 µm.

13. The method according to claim 1,
wherein in step A) an auxiliary carrier of GaAs is provided on which the sacrificial layer of germanium is epitaxially grown in step B) which has a layer thickness between 2 nm and 20 µm, subsequently in step C), a semiconductor layer sequence of AlInGaP is epitaxially grown, wherein the sacrificial layer is removed in step D) such that the auxiliary carrier is removed and is configured to be reused as auxiliary carrier for epitaxial deposition.

14. The method according to claim 1,
wherein a buffer layer of GaAs is applied between the sacrificial layer and the auxiliary carrier.

15. An optoelectronic component formed by the method of claim 1.

16. A method for producing at least one optoelectronic component comprising:
A) providing an auxiliary carrier,
B) epitaxially applying a sacrificial layer on the auxiliary carrier, wherein the sacrificial layer consists of germanium,
C) epitaxially applying a semiconductor layer sequence on the sacrificial layer,
D) removing the sacrificial layer by dry etching such that the auxiliary carrier is removed from the semiconductor layer sequence, wherein
the dry etching is a methods comprising inductively coupled plasma (ICP), reactive ion etching (RIE), vapor hydrofluoric acid method (VHF),
at least one of the following process gases is used for the dry etching: $Cl_2$, $SiCl_2$, $BCl_3$, and $CCl_2F_2$,
the semiconductor layer sequence is structured after step C),
the arrangement produced in step C) is applied to a substrate before step D) such that the substrate is arranged on the side of the semiconductor layer sequence facing away from the auxiliary carrier, and
the arrangement produced in step C) comprises a void directly surrounded by the sacrificial layer, the semiconductor layer sequence and the substrate such that at least a part of the substrate facing towards the sacrificial layer is free of the semiconductor layer sequence.

17. A method for producing at least one optoelectronic component comprising:
A) providing an auxiliary carrier,
B) epitaxially applying a sacrificial layer on the auxiliary carrier, wherein the sacrificial layer consists of germanium,
C) epitaxially applying a semiconductor layer sequence on the sacrificial layer,
D) removing the sacrificial layer by dry etching such that the auxiliary carrier is removed from the semiconductor layer sequence, wherein the dry etching is a methods comprising inductively coupled plasma (ICP), reactive ion etching (RIE), vapor hydrofluoric acid method (VHF),
at least one of the following process gases is used for the dry etching: Cl2, SiCl2, BCl3, and CCl2F2,
the arrangement produced in step C) is applied to a substrate before step D) such that the substrate is arranged on the side of the semiconductor layer sequence facing away from the auxiliary carrier, and
the semiconductor layer sequence is in direct contact to the substrate.

* * * * *